(12) United States Patent
Domoto

(10) Patent No.: US 8,593,056 B2
(45) Date of Patent: Nov. 26, 2013

(54) ELECTROLUMINESCENT DEVICE

(75) Inventor: Chiaki Domoto, Shiga (JP)

(73) Assignee: LG Display Co., Ltd., Seoul (KR)

( * ) Notice: Subject to any disclaimer, the term of this patent is extended or adjusted under 35 U.S.C. 154(b) by 1083 days.

(21) Appl. No.: 12/576,364

(22) Filed: Oct. 9, 2009

(65) Prior Publication Data

US 2010/0044728 A1 Feb. 25, 2010

Related U.S. Application Data

(63) Continuation of application No. 11/536,721, filed on Sep. 29, 2006, now Pat. No. 7,623,199.

(30) Foreign Application Priority Data

Sep. 30, 2005 (JP) .................................. 2005-287768

(51) Int. Cl.
*H01L 51/50* (2006.01)
(52) U.S. Cl.
USPC ............................. 313/504; 313/506; 313/512
(58) Field of Classification Search
USPC .................................................. 313/500–512
See application file for complete search history.

(56) References Cited

U.S. PATENT DOCUMENTS 6,232,714 B1 5/2001 Shen et al.
2005/0127831 A1 6/2005 Takeuchi et al.

*Primary Examiner* — Mary Ellen Bowman
(74) *Attorney, Agent, or Firm* — Birch, Stewart, Kolasch & Birch, LLP

(57) ABSTRACT

An electroluminescent device includes, for example, first to third optical output parts respectively corresponding to red, green, and blue colors and each having a light-emitting layer. A visibility spectrum curve has an inclination value corresponding to the first optical output part, an inclination value corresponding to the second optical output part, and an inclination value corresponding to the third optical output part. Each inclination value corresponds to an emission peak wavelength at which an emission spectrum of a light ray emitted from the light-emitting layer of the corresponding optical output part reaches a maximum intensity value. The inclination values have the following relationship: first optical output part>second optical output part>third optical output part. The emission spectra of the optical output parts have widths in the following relationship: first optical output part>second optical output part>third optical output part.

12 Claims, 8 Drawing Sheets

ELECTROLUMINESCENT DEVICE

CROSS-REFERENCE TO RELATED APPLICATIONS

This application is a continuation of U.S. patent application Ser. No. 11/536,721, filed Sep. 26, 2006, which claims the benefit of Japanese Patent Application No. 2005-287768, filed Sep. 30, 2005, which is incorporated by reference as if fully set forth.

BACKGROUND OF THE INVENTION

1. Field of the Invention

The present invention relates to electroluminescent devices that perform multicolor light emission.

2. Description of the Related Art

Generally, an electroluminescent device has a plurality of optical output parts, each including a light-emitting layer and a resonator structure that resonates light emitted from the light-emitting layer. The resonator structure includes, for example, electrodes having the light-emitting layer interposed therebetween. A resonant wavelength of the light resonated by the resonator structure changes in accordance with an output angle of the light output from the electroluminescent device. Thus, the intensity of the light output from the electroluminescent device changes in accordance with the output angle of the light.

In an electroluminescent device that performs multicolor light emission, an intensity ratio among the multiple color light rays output from the respective optical output parts constituting pixels of the respective colors fluctuates in accordance with the output angle of the light rays, thus leading to color shifts in which the luminescent colors vary depending on the output angle (viewing direction).

However, in a typical electroluminescent device, the countermeasure against color shifts is insufficient, and therefore, color-shift prevention still needs to be improved.

Furthermore, since the sensitivity of the human eye (i.e. visibility) varies depending on the wavelength, it is necessary to prevent color shifts in view of the visibility.

Accordingly, it is an object of the present invention to provide an electroluminescent device that can suppress the occurrence of color shifts in the luminescent colors when the viewing direction changes.

SUMMARY OF THE INVENTION

An electroluminescent device according to the present invention includes first and second optical output parts emitting light rays having different wavelengths, and each optical output part has a light-emitting layer and a resonator structure that resonates light emitted from the light-emitting layer. A visibility spectrum curve has a first inclination value corresponding to the first optical output part and a second inclination value corresponding to the second optical output part, and the second inclination value is greater than the first inclination value at an emission peak wavelength at which an emission spectrum of the light ray emitted from the light-emitting layer of the corresponding optical output part reaches a maximum intensity value. The emission spectrum of the second optical output part has a larger width than that of the first optical output part.

DESCRIPTION OF THE PREFERRED EMBODIMENTS

Description of Terms

In this specification, the term "perceived intensity" refers to the intensity of light that is actually perceived by a person when the light enters an eye of the person. Therefore, a perceived intensity does not indicate a mere intensity of light, but rather indicates an intensity of light determined in view of the effect of visibility, that is, the sensitivity of the human eye.

(Principle of how Color Shifts Occur)

Before describing embodiments of the present invention below, the principle of how color shifts occur will be described first.

Figure 1A:
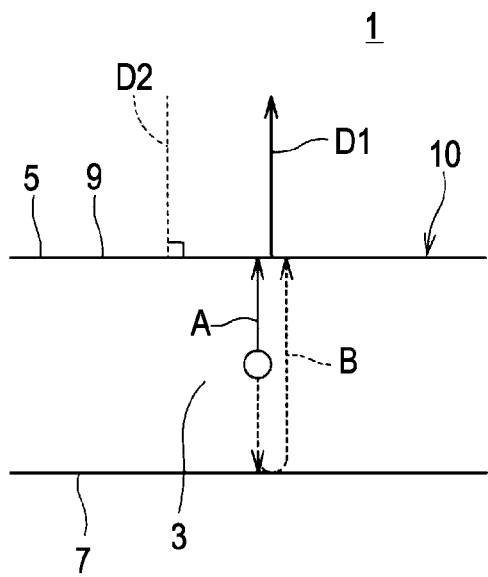
FIGS. 1A and 1B illustrate a relationship between characteristics of a resonator structure included in an electroluminescent device and a light output direction.
Figure 1B:
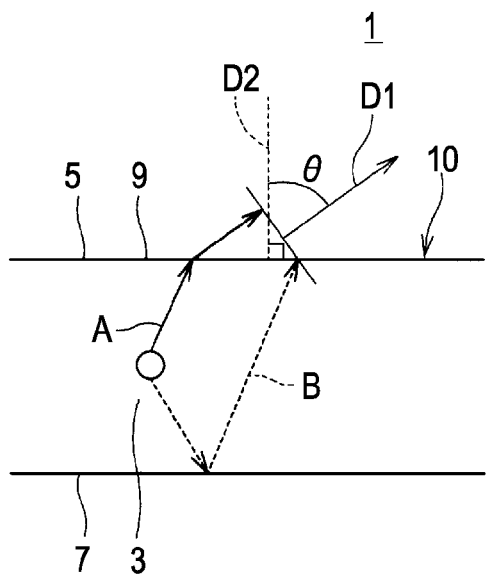

FIGS. 1A and 1B illustrate a relationship between characteristics of a resonator structure included in an electroluminescent device and a light output direction.

Referring to FIGS. 1A and 1B, an electroluminescent device 1 has an optical output part 10 including an organic layer 3. The organic layer 3 includes a light-emitting layer that produces electroluminescence, and has opposite surfaces that function as reflective surfaces 5, 7 defined by, for example, electrodes. The reflective surfaces 5, 7 constitute a resonator structure 9. Thus, light output towards a viewer from the electroluminescent device 1 is a combination of a light component emitted by the organic layer 3 and transmitted through the reflective surface 5 without being reflected by the reflective surfaces 5, 7, and a light component emitted by the organic layer 3 and transmitted through the reflective surface 5 after being reflected one or more times by the reflective surfaces 5, 7. Each of the reflective surfaces 5, 7 is an interface at which the refractive index changes significantly. For example, each of the reflective surfaces 5, 7 may be defined by an electrode, or may be a surface of an adjustment layer for adjusting light transmission characteristics, a surface of a sealing film for sealing the organic layer 3, or a surface of a glass substrate (i.e. transparent substrate). On the other hand, the optical output part 10 comprises the organic layer 3 that emits light and the resonator structure 9 provided on an optical path of the light emitted from the organic layer 3.

Figure 2:
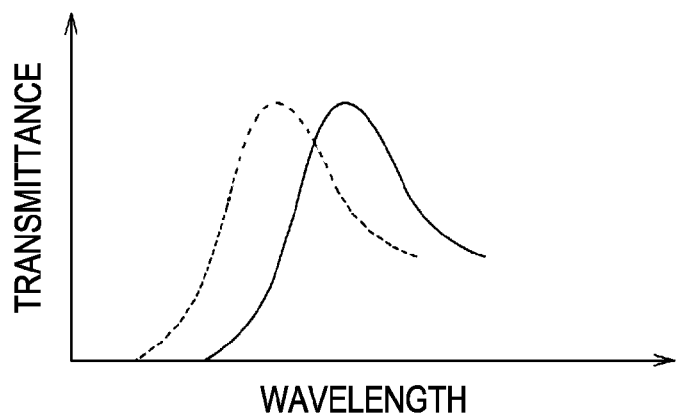
FIG. 2 illustrates a transmission spectrum of the resonator structure.

As shown in FIGS. 1A and 1B, the resonator structure 9 has characteristics in which the optical path of the light combined in and released from the resonator structure 9 varies depending on an output direction D1 of light to be output from the electroluminescent device 1 and a resonant wavelength changes in accordance with the optical path. In other words, FIGS. 1A and 1B show an optical path A in which light is not reflected and an optical path B in which light is reflected once when the light output direction D1 changes. FIG. 1A corresponds to a case where the light output direction D1 is parallel to a front direction D2, which is perpendicular to an emission plane of the electroluminescent device 1. FIG. 1B corresponds to a case where the light output direction D1 is slanted with respect to the front direction D2. An optical-path difference between the optical paths A and B is reduced as an output angle θ increases, whereby the resonant wavelength shifts towards a shorter wavelength side in response to the increase in the output angle θ. Accordingly, a transmission spectrum, which is obtained when the light emitted from the organic layer 3 passes through the resonator structure 9, changes from a state indicated by a solid line in FIG. 2 to a state indicated by a dotted line as the output angle θ increases. In this case, the term "output angle θ" refers to a slanted angle of the light output direction D1 with respect to the front direction D2.

Figure 3:
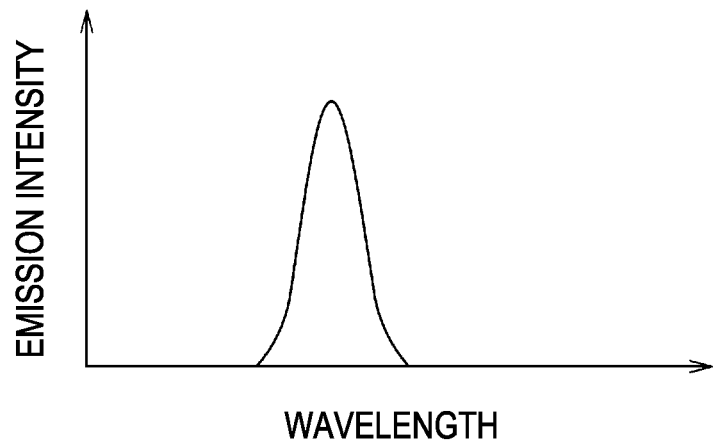
FIG. 3 illustrates an emission spectrum of an organic layer.

An emission spectrum of light emitted by the organic layer 3 is determined on the basis of material characteristics of the organic layer 3, and has, for example, a pattern shown in FIG. 3. The emission spectrum is fixed regardless of the output angle θ of light output in the light output direction D1. Reference numeral λ1 in FIG. 3 indicates an emission peak wavelength corresponding to a maximum value of the emission spectrum. The term "emission peak wavelength" will be used hereinafter to indicate a wavelength at which an emission spectrum reaches a maximum value.

Figure 4:
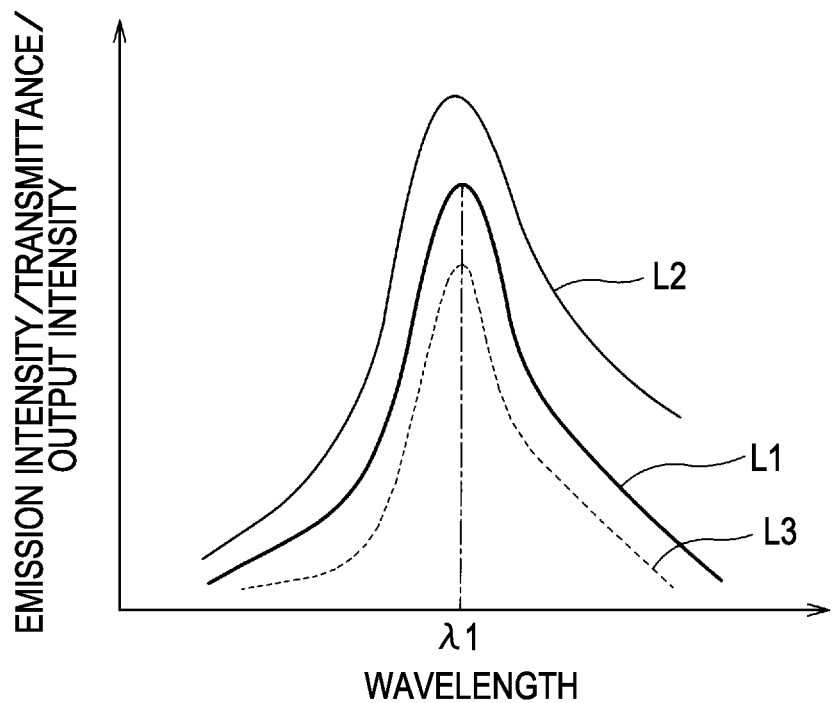
FIG. 4 illustrates relationships among an emission spectrum of the organic layer, a transmission spectrum of the resonator structure, and an output spectrum of output light.

FIG. 4 illustrates relationships among an emission spectrum of light emitted by the organic layer 3, a transmission spectrum indicating a proportion of the light emitted from the organic layer 3 that is output outward via the resonator structure 9, and an output spectrum of light that is actually output from the electroluminescent device 1. Specifically, a curve L1 represents the emission spectrum, a curve L2 represents the transmission spectrum, and a curve L3 represents the output spectrum. The transmission spectrum (L2) and the output spectrum (L3) correspond to a case where the output angle θ of light in the light output direction D1 is 0°. As shown in FIG. 4, the output spectrum (L3) is determined from a product of the emission spectrum (L1) and the transmission spectrum (L2).

The ordinate axis in the graph shown in FIG. 4 represents light transmittance for the curve L2 (transmission spectrum), and light intensity for the curve L1 (emission spectrum) and the curve L3 (output spectrum). The same applies to FIGS. 5 and 11.

As mentioned above, although the emission spectrum (L1) is not dependant on the output angle θ, the transmission spectrum (L2) is dependant on the output angle θ. Therefore, the relationship between the emission spectrum (L1) and the transmission spectrum (L2) varies in accordance with the output angle θ, and the output spectrum (L3) changes in accordance with that relationship.

Figure 5:
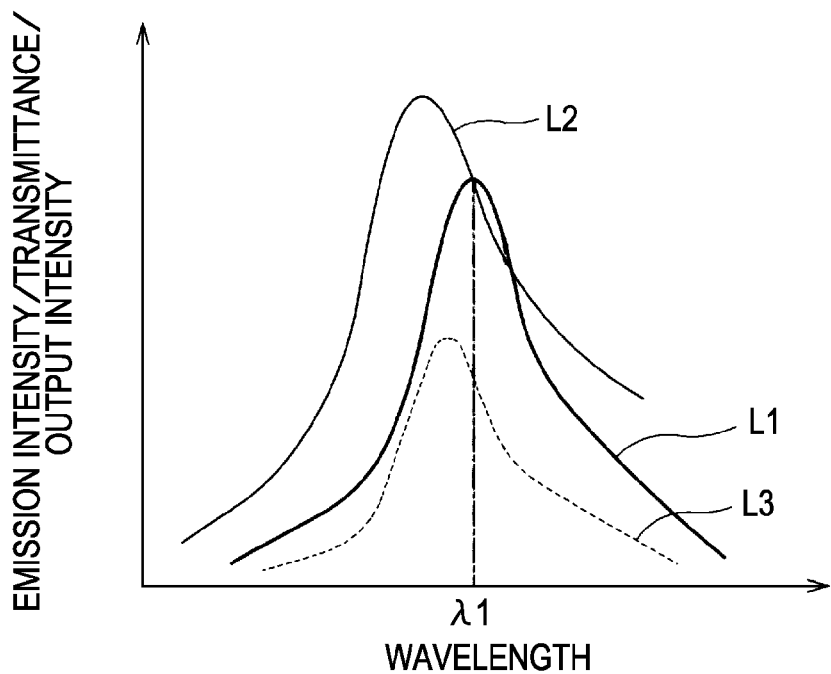
FIG. 5 illustrates relationships among the emission spectrum, the transmission spectrum, and the output spectrum when the output direction is slanted.

FIG. 5 illustrates relationships among the emission spectrum, the transmission spectrum, and the output spectrum when the output direction D1 is slanted. By comparing the spectra shown in FIGS. 4 and 5, it is understood that the transmission spectrum (L2) shifts towards the shorter wavelength side as the output direction D1 becomes more slanted, thereby causing the output spectrum (L3) of the light actually output from the optical output part 10 to shift also to the shorter wavelength side while the output spectrum (L3) is reduced in whole.

Figure 6:
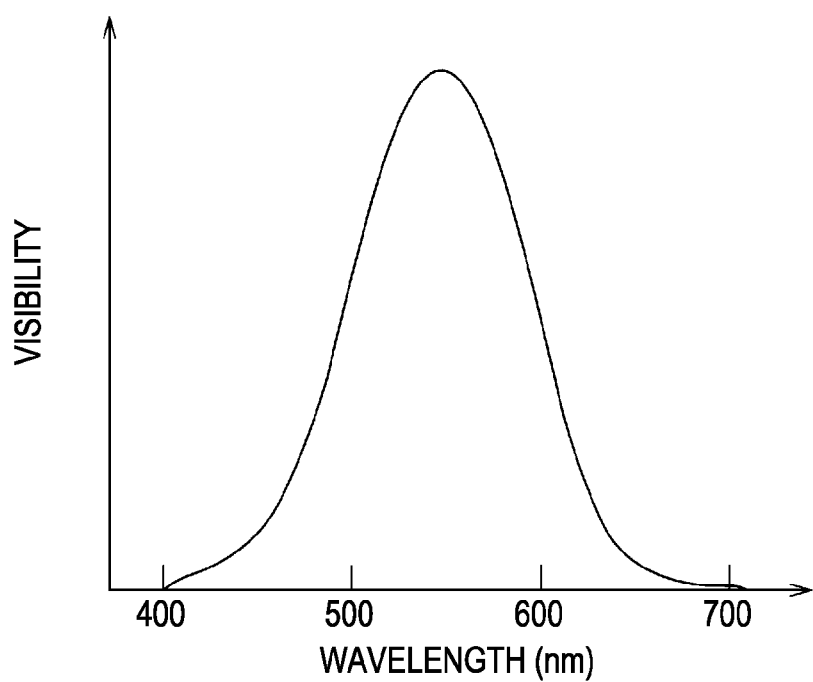
FIG. 6 illustrates a visibility spectrum.

Furthermore, since the sensitivity of the human eye (i.e. visibility) varies depending on the wavelength of light entering the eye, it is necessary to take into consideration the effect of visibility especially in a case where the electroluminescent device 1 is a type that performs multicolor light emission. FIG. 6 illustrates a visibility spectrum. The visibility spectrum in FIG. 6 has a curve in which the human-eye sensitivity is at maximum against light of a green wavelength near 550 nm (which will simply be referred to as "green" in this embodiment except in practical examples), but decreases drastically against light of a red wavelength near 620 nm (which will simply be referred to as "red" in this embodiment except in practical examples) and light of a blue wavelength near 450 nm (which will simply be referred to as "blue" in this embodiment except in practical examples). Thus, when the wavelength changes, the degree of change in visibility is greater near the red and blue wavelengths than near the green wavelength. The inclination angle of the visibility spectrum curve is substantially zero near the green wavelength, is a positive value near the blue wavelength, and is a negative value near the red wavelength.

Consequently, referring to FIG. 4, when a plurality of optical output parts 10 is provided in correspondence to the red, green, and blue colors, the wavelength at which a transmission spectrum of each optical output part 10 reaches a maximum value is substantially aligned with the emission peak wavelength of the corresponding color when the light may be output in the front direction D2 of the resonator structure 9 (output angle θ=0°). The wavelength at which a transmission spectrum reaches a maximum value will be referred to as "resonant peak wavelength" hereinafter. However, even so, as the output angle θ increases, the transmission spectrum shifts towards the shorter wavelength side, thus causing the output spectrum to shift towards the shorter wavelength side. As a result, referring to the visibility spectrum shown in FIG. 6, the output spectrum corresponding to the red light shifts in the direction in which the visibility increases, whereas the output spectra corresponding to the green and blue light shift in the direction in which the visibility decreases. Thus, even if the decreasing degrees of the output spectra corresponding to the red, green, and blue light rays are substantially the same when the output angle θ increases, the decreasing degree of the perceived intensity of the green light ray is greater than that of the red light ray, and the decreasing degree of the perceived intensity of the blue light ray is greater than that of the green light ray when the output angle θ increases. The perceived intensity indicates the intensity of light that is actually perceived by an eye of a person.

Figure 7:
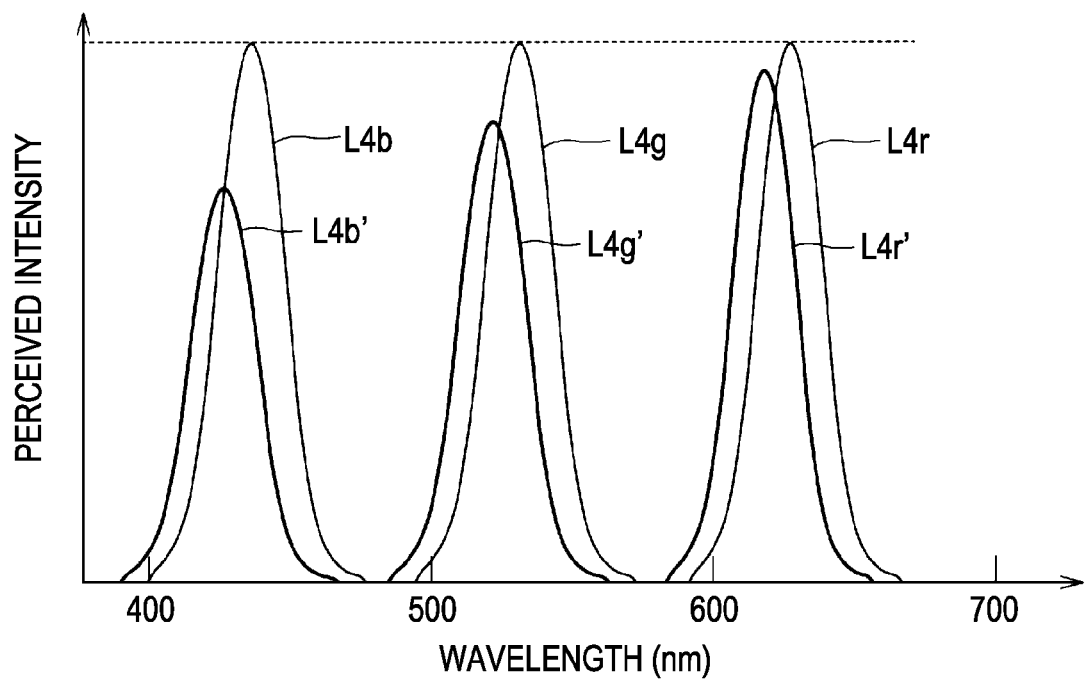
FIG. 7 illustrates the degree of change in perceived intensities of light rays of corresponding colors when an output angle changes.
Figure 8:
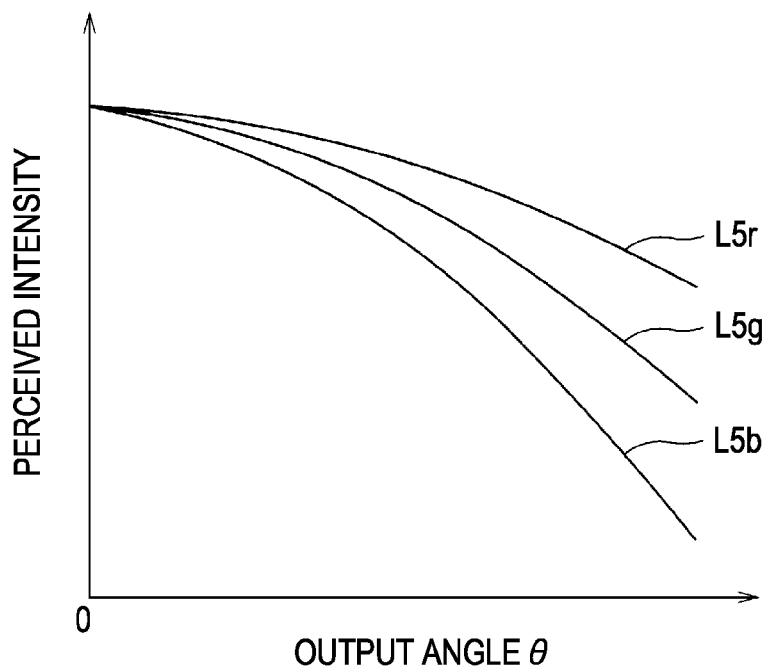
FIG. 8 illustrates relationships between the output angle and the perceived intensities of the corresponding colors.

FIG. 7 illustrates the degree of change in the perceived intensities of the light rays of the corresponding colors when the output angle θ changes. In FIG. 7, thin-line curves L4r, L4g, L4b represent normalized perceived-intensity spectra of the red, green, and blue colors, respectively, when the output angle θ is 0°. Each perceived-intensity spectrum is determined from a product of the corresponding output spectrum and the corresponding visibility spectrum. Each perceived-intensity spectrum is normalized such that, for example, a maximum value of the perceived intensity of the corresponding color is set as 1. Moreover, thick-line curves L4r', L4g', L4b' in FIG. 7 represent perceived-intensity spectra when the output angle θ is 30°, and are shown with reference to the perceived-intensity spectra (L4r, L4g, L4b) when the output angle θ is 0°. FIG. 8 illustrates relationships between the output angle θ and the perceived intensities of the corresponding colors (i.e. maximum values of the perceived-intensity spectra). In FIG. 8, curves L5r, L5g, L5b are used to indicate the relationships between the output angle θ and the perceived intensities of the light rays of the corresponding colors that are actually output from the optical output parts 10.

Referring to FIGS. 7 and 8, the ratio of the perceived intensities among the colors changes significantly as the value of the output angle θ increases. Therefore, if the luminescent colors of the electroluminescent device are supposedly set with using the output angle θ of 0° as a standard, the luminescent colors are subject to color shifts as the output angle θ increases. Specifically, even if the ratio of the perceived intensities among the light rays output from the optical output parts 10 for the corresponding colors is set at the ratio by which white light is exhibited when the output angle θ is 0°, the perceived intensity of the green light will be relatively higher than that of the blue light, and the perceived intensity of the red light will be relatively higher than that of the green light as the output angle θ increases. Thus, the white light will appear to be somewhat reddish.

The present inventors have invented means for reducing color shifts, which is achieved by adjusting the relationships among the emission spectra (L1r, L1g, L1b) of the optical output parts 10 for the corresponding colors included in an electroluminescent device.

(Configuration of Electroluminescent Device)

Figure 9:
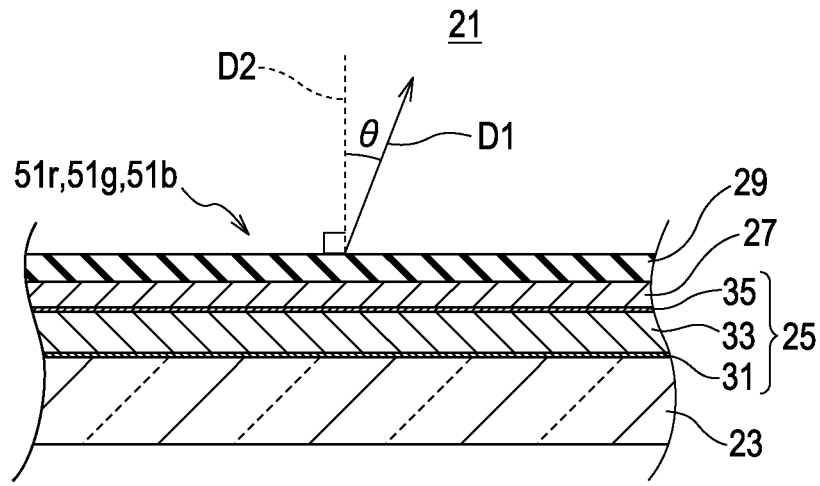
FIG. 9 is a schematic cross-sectional view illustrating an electroluminescent device according to an embodiment of the present invention.

FIG. 9 is a schematic cross-sectional view illustrating an electroluminescent device 21 according to a first embodiment of the present invention. The electroluminescent device 21 is a top emission type and includes a glass substrate 23 serving as a transparent substrate, element portions 25 disposed on the glass substrate 23, adjustment layers 27 disposed on the element portions 25, and a sealing film 29 extending from the top of the adjustment layers 27 to entirely cover the element portions 25. Each of the element portions 25 includes a first electrode 31, an organic layer 33, and a second electrode 35 disposed in that order from the glass substrate 23. Thus, the organic layer 33 is interposed between the first electrode 31 and the second electrode 35.

Figure 10:
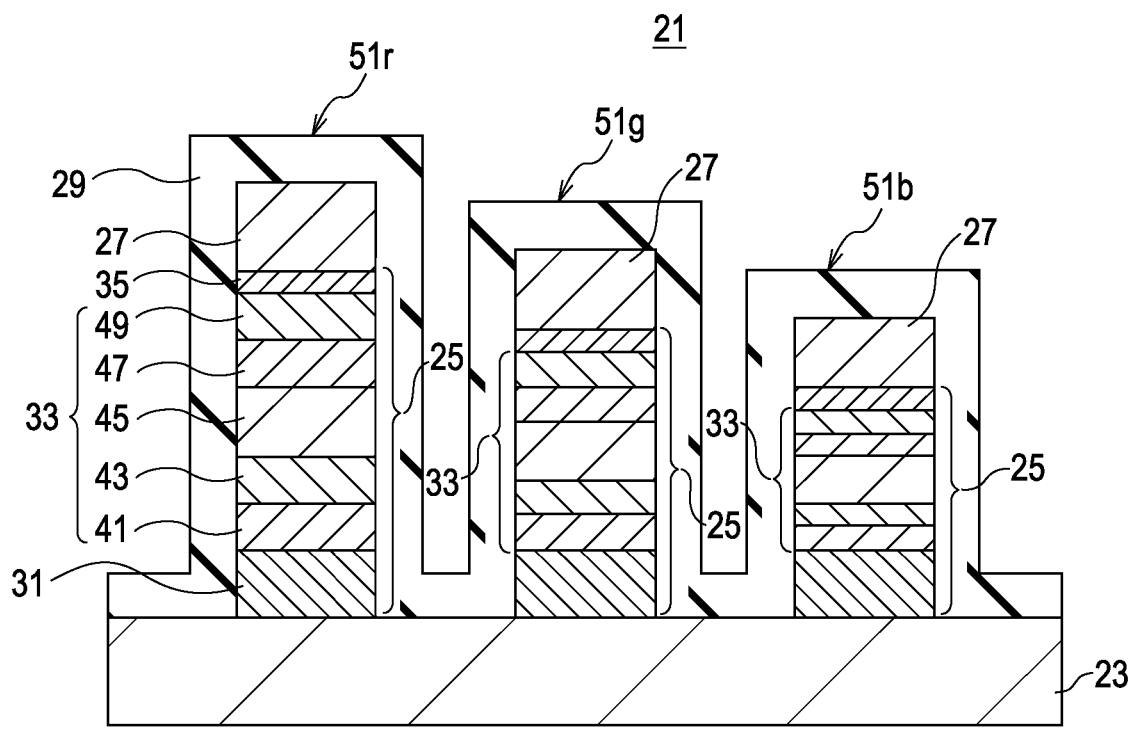
FIG. 10 is a schematic cross-sectional view illustrating first to third optical output parts included in the electroluminescent device shown in FIG. 9.

Referring to FIG. 10, in order to perform multicolor light emission, the electroluminescent device 21 is provided with first to third optical output parts 51r, 51g, 51b in correspondence to red, green, and blue colors, respectively. In this case, each of the optical output parts 51r, 51g, 51b comprises the organic layer 33 that emits light and the abovementioned resonator structure 9 (see FIGS. 1A and 1B) disposed on an optical path of the light emitted from the organic layer 33. A detailed example and characteristics of the resonator structure 9 are as described above.

The organic layers 33 in the first to third optical output parts 51r, 51g, 51b are composed of appropriate materials for producing light rays of red, green, blue wavelengths, respectively.

The adjustment layers 27 are provided for adjusting the light transmission characteristics of the first to third optical output parts 51r, 51g, 51b. Each adjustment layer 27 is given a predetermined optical thickness (nd) that allows extraction efficiency of light traveling through the corresponding optical output part 51r, 51g, 51b to be large. Alternatively, there may be a case where the adjustment layers 27 are omitted from the first to third optical output parts 51r, 51g, 51b. The adjustment layers 27 may be formed by, for example, vapor deposition. Therefore, by using, for example, a metal mask, the adjustment layers 27 can be formed individually for the corresponding optical output parts 51r, 51g, 51b. As a suitable material used for forming the adjustment layers 27, transparent organic materials, such as styrylarylene and polysilane, or transparent inorganic materials, such as titanium oxide and zinc sulfide, for example, are known. In particular, the organic materials are advantageous in requiring a lower temperature for vapor deposition, which means that the element portions 25 receive less damage from an increased temperature of the glass substrate 23. In addition, due to requiring a lower temperature for vapor deposition, the organic materials allow for less deformation of the metal mask when the temperature of the metal mask is increased, thereby preventing pattern blurring from occurring. Furthermore, in FIG. 9, since the adjustment layer 27 of each optical output part is disposed in contact with the second electrode 35, the adjustment layer 27 can be formed in the same chamber or the same vacuum used when forming the organic layer 33 and the second electrode 35. Accordingly, this allows for a reduction in the size of a manufacturing apparatus, and contributes to an improved tact time for the manufacturing process.

The sealing film 29 is provided for sealing the organic layers 33, the second electrodes 35, and the like, and is disposed so as to completely cover the region in which the element portions 25 of the electroluminescent device 21 are provided. The sealing film 29 is composed of an insulating material having optical transparency, such as SiNx, and commonly covers the optical output parts 51r, 51g, 51b.

The structure of each element portion 25 will now be described. The first electrode 31 reflects at least a portion of the light emitted by the organic layer 33 back towards the organic layer 33, and may be composed of a transparent, semitransparent, or nontransparent electrode material. In order to increase the light reflectance, however, the first electrode 31 is preferably a semitransparent electrode or a nontransparent electrode. More preferably, the first electrode 31 is a reflective electrode composed of, for example, Al. The second electrode 35 may be composed of any type of conductive material that transmits light. In order to increase the light transmittance, however, the second electrode 35 is preferably a semitransparent electrode or a transparent electrode. If a nontransparent electrode material is used, the material has high electrical conductivity and optical characteristics for blocking most of visible light. If a transparent electrode material is used, the material may have relatively high electrical conductivity and optical characteristics for transmitting a large portion of visible light. If a semitransparent electrode material is used, the material may have intermediate characteristics between those of transparent and nontransparent electrode materials. Therefore, if a semitransparent electrode material is used, the electrode will require optical characteristics for transmitting visible light. This may be achieved by reducing the thickness of the electrode.

A suitable material for a transparent electrode is, for example, ITO or IZO. In this case, the transparent electrode preferably has a thickness of 50 nm or more, and more preferably, has a thickness within a range of 100 nm to 300 nm. A suitable material for a nontransparent electrode is, for example, Al. In this case, the nontransparent electrode preferably has a thickness within a range of 100 to 300 nm. A suitable material for a semitransparent electrode is, for example, an alkaline metal such as Li, an alkaline earth metal such as Mg, Ca, Sr, and Ba, or other materials such as Al, Si, and Ag. In this case, the semitransparent electrode preferably has a thickness of less than 100 nm, and more preferably, has a thickness within a range of 5 nm to 50 nm.

Referring to FIG. 10, each organic layer 33 includes a charge injection layer 41 for performing hole or electron injection, a charge transport layer 43 for performing hole or electron transport, a light-emitting layer 45 for producing electroluminescence, a charge transport layer 47 for performing electron or hole transport, and a charge injection layer 49 for performing electron or hole injection. These layers are disposed in the above order from the glass substrate 23. Although at least a portion of each organic layer 33 is composed of an organic material in the first embodiment, at least one of the layers 41, 43, 45, 47, and 49 in the organic layer 33 may be composed of an inorganic material. Alternatively, all of the layers 41, 43, 45, 47, and 49 may be composed of an inorganic material.

Furthermore, although each organic layer 33 in the first embodiment has a five-layer structure, the layer structure of each organic layer 33 may be arbitrarily determined in accordance with various conditions. In other words, the layer structure may be, for example, one of a two-layer to four-layer structures, or a single-layer structure having only the light-emitting layer 45. For example, the structure and material of each organic layer 33 are determined in accordance with the reflective characteristics (nontransparent, semitransparent, or transparent characteristics) and the polarity (for example, anode or cathode) of the first electrode 31 and the second electrode 35, and also in accordance with the type of luminescent color (red, green, or blue) to be emitted by the organic layer 33. In detail, for example, a material such as an $Alq_3$ emits green light as well as having high electron transportability. Therefore, the element portion 25 for emitting green light may have its light-emitting layer and electron transport layers formed of a single material, such as Alq3. Furthermore, when transparent electrodes are used, the electron injection layers are generally formed of metal. The first electrodes 31, the second electrodes 35, and the organic layers 33 are formed by a commonly known thin-film formation technique, such as vapor deposition. On the other hand, the sealing film 29 is also formed by a commonly known thin-film formation technique, such as chemical vapor deposition (CVD) and vapor deposition.

(Color-Shift Prevention)

Figure 11:
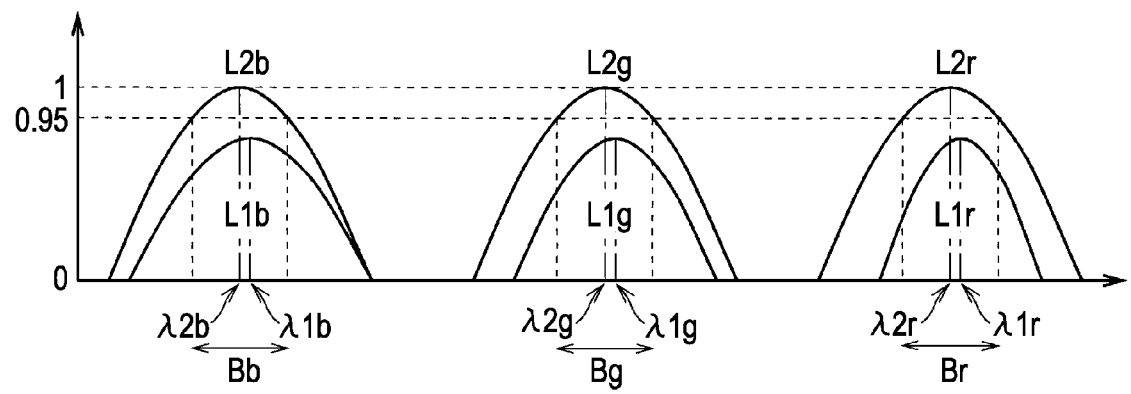
FIG. 11 illustrates relationships between emission spectra and transmission spectra of the corresponding colors in the electroluminescent device shown in FIG. 9.

Means for reducing color shifts in the electroluminescent device 21 according to this embodiment will now be described. FIG. 11 illustrates relationships between emission spectra (L1r, L1g, L1b) and transmission spectra (L2r, L2g, L2b) of the corresponding colors in the electroluminescent device 21 shown in FIG. 9. As shown in FIG. 11, in this embodiment, the transmission spectra (L2r, L2g, L2b) of the resonator structures 9 in the optical output parts 51r, 51g, 51b reach maximum values at resonant peak wavelengths λ2r, λ2g, λ2b, respectively. The resonant peak wavelengths λ2r, λ2g, λ2b are set substantially equal to emission peak wavelengths λ1r, λ1g, λ1b at which the emission spectra (L1r, L1g, L1b) of the optical output parts 51r, 51g, 51b are at maximum intensity values, or may be set less than the emission peak wavelengths λ1r, λ1g, λ1b.

The phrase "the resonant peak wavelengths λ2r, λ2g, λ2b are set substantially equal to the emission peak wavelengths λ1r, λ1g, λ1b" means that the emission peak wavelengths λ1r, λ1g, λ1b are within respective wavelength ranges Br, Bg, Bb of the transmission spectra (L2r, L2g, L2b) that correspond to 95% or more of the maximum values of the transmission spectra (L2r, L2g, L2b) in the optical output parts 51r, 51g, 51b, as shown in FIG. 11. On the other hand, the phrase "the resonant peak wavelengths λ2r, λ2g, λ2b are set less than the emission peak wavelengths λ1r, λ1g, λ1b" means that the emission peak wavelengths λ1r, λ1g, λ1b are shifted towards the shorter wavelength side from the ranges Br, Bg, Bb.

Accordingly, by setting the resonant peak wavelengths λ2r, λ2g, λ2b substantially equal to the respective emission peak wavelengths λ1r, λ1g, λ1b, attenuation fluctuation of the output spectra, which are products of the emission spectra (L1r, L1g, L1b) and the transmission spectra (L2r, L2g, L2b), respectively, is reduced even when the value of the output angle θ increases.

Figure 12:
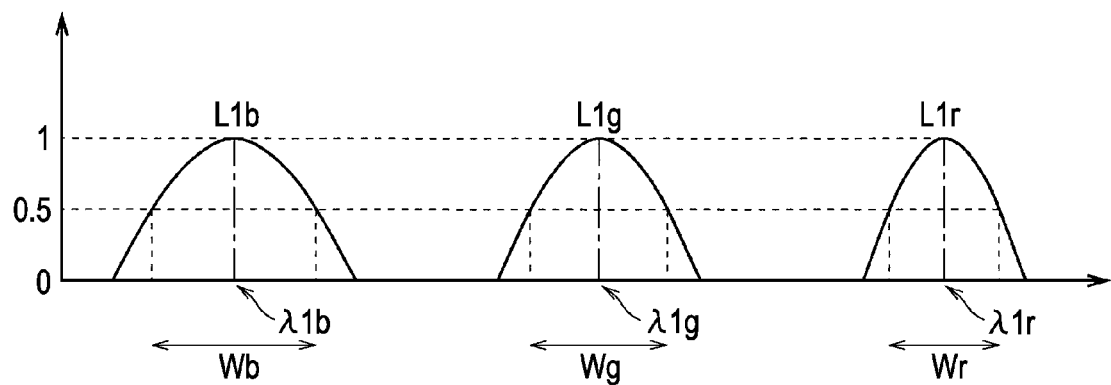
FIG. 12 illustrates the emission spectra of the first to third optical output parts included in the electroluminescent device shown in FIG. 9.

Furthermore, referring to FIG. 12, in this embodiment, the widths Wr, Wg, Wb of the emission spectra (L1r, L1g, L1b) at which the intensities of the emission spectra (L1r, L1g, L1b) of the optical output parts 51r, 51g, 51b are at 50% (half width) satisfy the following relationship: Wr<Wg<Wb. In other words, the half width Wg of the emission spectrum (L1g) corresponding to the green color is set wider than the half width Wr of the emission spectrum (L1r) corresponding to the red color, and the half width Wb of the emission spectrum (L1b) corresponding to the blue color is set wider than the half width Wg of the emission spectrum (L1g) corresponding to the green color.

By setting the magnitude relationship of the half widths Wr, Wg, Wb of the respective emission spectra (L1r, L1g, L1b) as above, the decreasing degrees of the output intensities of the light rays actually output from the optical output parts 51r, 51g, 51b can be suppressed more for optical output parts whose decreasing degrees of visibility are larger when the value of the output angle θ increases, thereby causing the transmission spectra (L2r, L2g, L2b) of the corresponding resonator structures 9 in the optical output parts 51r, 51g, 51b to shift towards the shorter wavelength side. Accordingly, this enables less variation among the decreasing degrees of the perceived intensities of the corresponding colors when the output angle θ increases, thereby achieving less color shifting.

Elements constituting the resonator structures 9, which will be referred to as "resonator-structure elements" hereinafter, basically may include any layers and components that are within a region through which light passes. In detail, in a case where the electroluminescent device 21 is a top emission type, the light emitted from the light-emitting layers 45 are transmitted through the sealing film 29 before being eventually output outward. Therefore, the resonator-structure elements include, for example, the layers interposed between the electrodes 31 and 35, the adjustment layers 27, and the sealing film 29. In other words, the resonator structures 9 are a combination of these elements. In this case, the resonator-structure elements that are interposed between the electrodes 31 and 35 have the most significant effect on the characteristics of the entire resonator structure 9.

Each of the half widths Wr, Wg, Wb of the respective emission spectra (L1r, L1g, L1b) is measured in the following manner. Specifically, a section of the organic layer (or more preferably, the light-emitting layer) in each of the optical output parts 51r, 51g, 51b is first exposed by etching or cutting using a focused ion beam (FIB). Then, the exposed section is irradiated with ultraviolet light so as to measure a photoluminescence spectrum with using the front direction D2 as a standard. The ultraviolet light is preferably emitted from a xenon lamp. Moreover, the ultraviolet light has a wavelength that corresponds to an absorption peak wavelength of the light-emitting layer. If such absorption peak wavelength is difficult to determine, the measurement may be implemented by emitting ultraviolet light having a 365-nm wavelength.

Furthermore, if it is difficult to measure a photoluminescence spectrum, the half widths Wr, Wg, Wb may alternatively be determined in the following manner. First, the optical output parts 51r, 51g, 51b are turned on to exhibit the maximum brightness, and the output spectra thereof with using the front direction D2 as a standard are measured. Next, the transmission spectra are determined from the resonator structures of the optical output parts 51r, 51g, 51b. Subsequently, the output spectra are divided by the transmission spectra so as to determine the emission spectra (L1r, L1g, L1b) of the optical output parts 51r, 51g, 51b. Finally, widths of the determined emission spectra (L1r, L1g, L1b) at positions corresponding to 50% of the maximum values thereof are determined as the half widths Wr, Wg, Wb.

The half widths Wr, Wg, Wb of the respective emission spectra (L1r, L1g, L1b) of the optical output parts 51r, 51g, 51b may be adjusted in the following manner. For example, the adjustment may be implemented on the basis of a dopant contained in each of the light-emitting layers 45. In other words, the adjustment may be implemented by changing the type of dopant, or changing the percentage of a dopant mixed in the light-emitting layer 45, or changing the combination of dopants, or changing the number of types of dopants to be combined. For example, by using a combination of two types of dopants that emit blue light rays of slightly different wavelengths, the half width Wb of the emission spectrum (L1b) corresponding to the blue color can be broadened. In this case, the two types of dopants may be mixed in a single light-emitting layer 45, or the light-emitting layer 45 may have a two-layer structure such that each of the two layers contains a type of a dopant different from that contained in the other. As a further alternative, one of the two types of dopants may be contained in the light-emitting layer 45, and the other type may be mixed in the charge transport layer 43 or 47 so as to allow the charge transport layer 43 or 47 to emit light.

Figure 13:
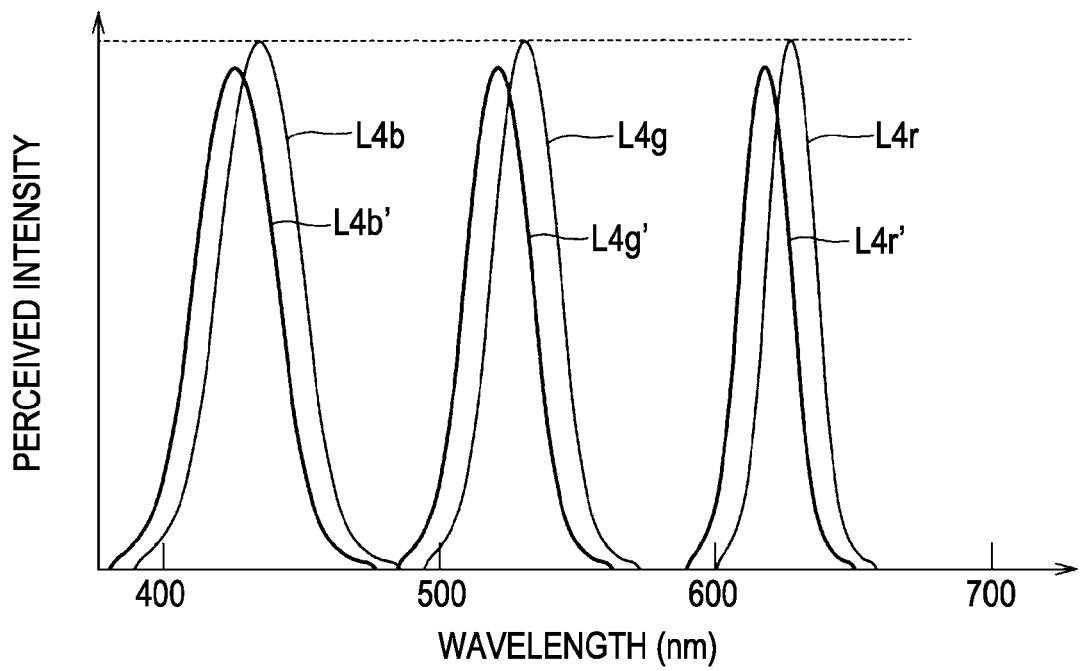
FIG. 13 illustrates the degree of change in perceived intensities of the corresponding colors when an output angle changes in the electroluminescent device shown in FIG. 9.
Figure 14:
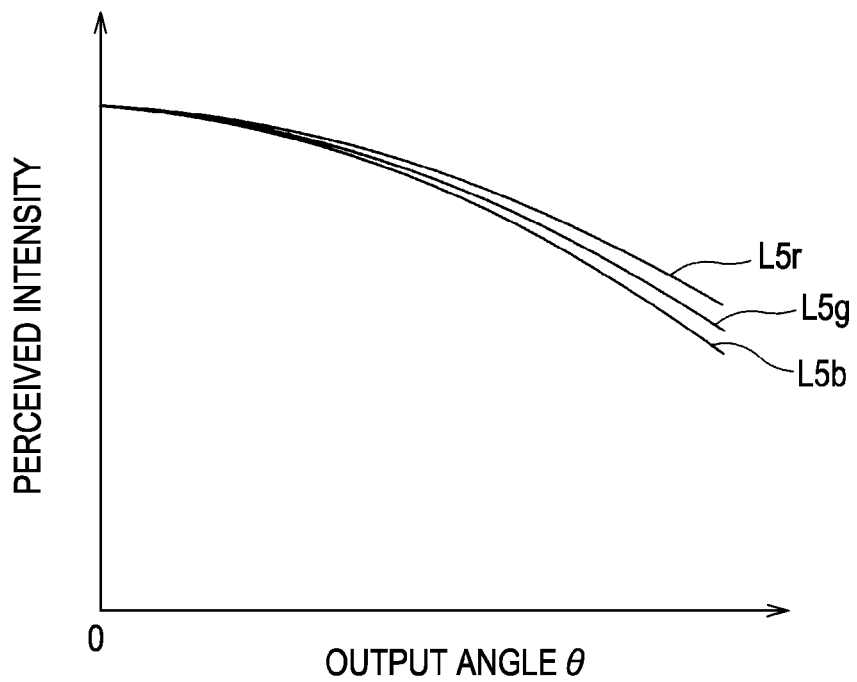
FIG. 14 illustrates relationships between the output angle and the perceived intensities of the corresponding colors in the electroluminescent device shown in FIG. 9.

FIG. 13 illustrates the degree of change in perceived-intensity spectra of the corresponding colors when the output angle θ changes in the electroluminescent device 21 according to this embodiment. The perceived-intensity spectra (L4r, L4g, L4b) in FIG. 13 are normalized in the same manner as in FIG. 7. In FIG. 13, thin-line curves L4r, L4g, L4b represent the perceived-intensity spectra of the corresponding colors when the output angle θ is 0°. On the other hand, thick-line curves L4r', L4g', L4b' show the perceived-intensity spectra when the output angle θ increases from 0° to a specific value (30°). Furthermore, FIG. 14 illustrates relationships between the output angle θ and the perceived intensities of the corresponding colors in the electroluminescent device 21 according to this embodiment. In FIG. 14, curves L5r, L5g, L5b are used to indicate the relationships between the output angle θ and the perceived intensities of the light rays of the corresponding colors that are actually output from the optical output parts 51r, 51g, 51b.

Referring to FIGS. 13 and 14, even when the perceived intensities of the light rays of the corresponding colors change in response to a change in the output angle θ, the fluctuation in the ratio of the perceived intensities among the colors is suppressed, as compared with the typical art. Consequently, color shifting is effectively reduced.

As described above, in this embodiment, the half widths Wr, Wg, Wb of the emission spectra (L1r, L1g, L1b) of the corresponding colors have the relationship, Wr<Wg<Wb. Thus, when the viewing direction becomes slanted with respect to the front direction D2, the decreasing degrees of the output intensities of the light rays actually output from the optical output parts 51r, 51g, 51b can be suppressed more for optical output parts whose decreasing degrees of visibility are larger when the wavelengths are shifted towards the shorter wavelength side. Accordingly, this enables less variation among the decreasing degrees of the perceived intensities of the corresponding colors when the viewing direction becomes slanted, thereby achieving less color shifts in the luminescent colors.

By setting the relationship between the emission spectra (L1r, L1g, L1b) and the transmission spectra (L2r, L2g, L2b) as above, attenuation fluctuation in the output spectra, which are products of the emission spectra (L1r, L1g, L1b) and the transmission spectra (L2r, L2g, L2b), respectively, is further reduced when the output angle θ increases from 0°. Consequently, this enables less color shifting of the luminescent colors when the viewing direction changes.

Figure 15:
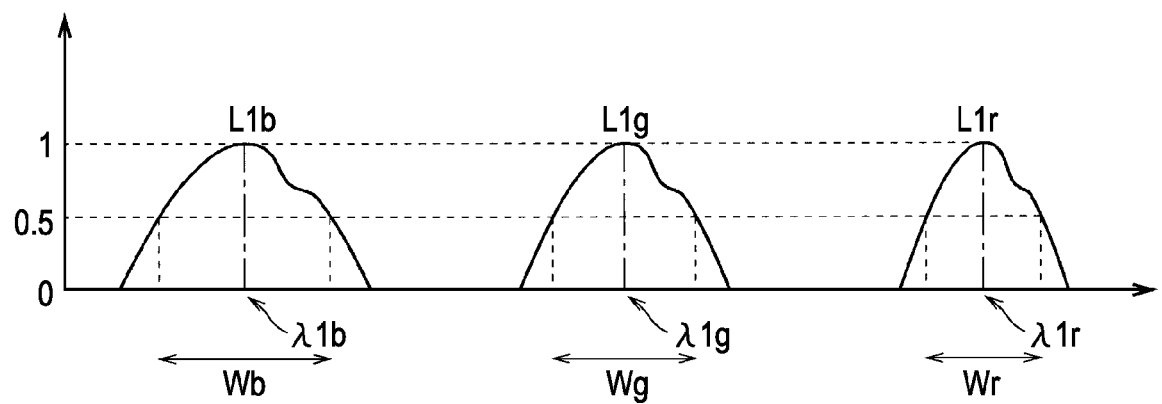
FIG. 15 shows emission spectra of first to third optical output parts included in an electroluminescent device according to another embodiment of the present invention.

Furthermore, by setting the widths of the emission spectra (L1r, L1g, L1b) on the basis of the half widths Wr, Wg, Wb, the relationship among the widths of the emission spectra (L1r, L1g, L1b) can be set while properly reflecting on the patterns of the emission spectra (L1r, L1g, L1b). For example, FIG. 15 shows emission spectra (L1r, L1g, L1b) having secondary peaks, which have an effect on the corresponding luminescent colors. Even in this case, the widths of the emission spectra (L1r, L1g, L1b) can be determined while additionally taking into consideration the effect of the secondary peaks.

Modified Embodiment

Figure 16:
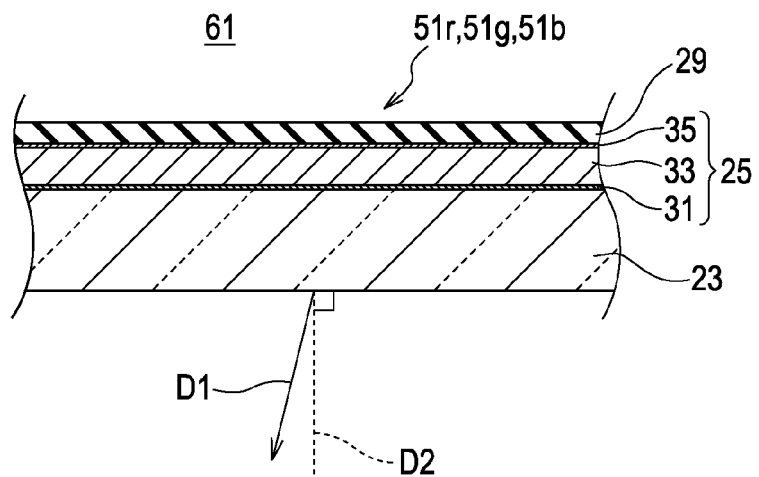
FIG. 16 is a schematic cross-sectional view illustrating an electroluminescent device according to a modified embodiment of the present invention.

Although the above embodiment is directed to the electroluminescent device 21 of a top emission type, the present invention is readily applicable to an electroluminescent device of a bottom emission type which outputs light via a glass substrate 23, as shown in FIG. 16. In the bottom emission type, each of the adjustment layers 27 may be disposed between the glass substrate 23 and the corresponding first electrode 31.

In this case, if each of the resonator structures 9 is to include other elements in addition to those interposed between the electrodes 31 and 35, the additional elements may be layers and components through which the light emitted from the light-emitting layer passes before being output outward. For example, each resonator structure may be defined by a region between a surface of the corresponding adjustment layer 27 proximate to the glass substrate 23 and a surface thereof opposite to the glass substrate 23, and a surface of the glass substrate 23 proximate to the corresponding element portion 25 and a surface thereof opposite to the element portion 25. In an electroluminescent device of a bottom emission type, it is not necessary to take into consideration the effect of the sealing film 29.

First Practical Example

In a first practical example, an organic electroluminescent element that emits blue light is fabricated. The organic electroluminescent element includes an anode, a hole transport layer, a first light-emitting layer, a second light-emitting layer, an electron injection layer, and a cathode, which are stacked in that order. The layers have the following configuration.
(a) Anode:
Material: aluminum
Thickness: 300 nm
(b) Hole Transport Layer:
Material: NPB
Thickness: 50 nm
(c) First Light-Emitting Layer:
Host material: SDPVBi
Host thickness: 10 nm
Dopant material: $Zn(BIZ)_2$
Volume concentration of dopant material with respect to host material: 2.0%
(d) Second Light-Emitting Layer:
Host material: SDPVBi
Host thickness: 10 nm
Dopant material: $Zn(BIZ)_2$
Volume concentration of dopant material with respect to host material: 0.5%
(e) Electron Injection Layer:
Material: magnesium
Thickness: 10 nm
(f) Cathode:
Material: ITO
Thickness: 100 nm According to the first practical example, an emission spectrum of the second light-emitting layer has an emission peak wavelength at 440 nm and a half width of 51 nm. An emission spectrum of the first light-emitting layer has an emission peak wavelength at 445 nm. As a result, since the two light-emitting layers both emit light, the half width of the output spectrum in the first practical example is 55 nm.

Second Practical Example

In a second practical example, an organic electroluminescent element that emits blue light is fabricated. The organic electroluminescent element includes an anode, a hole transport layer, a light-emitting layer, an electron injection layer, and a cathode, which are stacked in that order. The layers have the following configuration.
(a) Anode:
Material: aluminum
Thickness: 300 nm
(b) Hole Transport Layer:
Material: NPB
Thickness: 50 nm
(c) Light-Emitting Layer:
Host material: SDPVBi
Host thickness: 20 nm
First dopant material: $Zn(PhPy)_2$
Volume concentration of first dopant material with respect to host material: 0.5%
Second dopant material: $Zn(BIZ)_2$
Volume concentration of second dopant material with respect to host material: 0.5%
(d) Electron Injection Layer:
Material: magnesium
Thickness: 10 nm
(e) Cathode:
Material: ITO
Thickness: 100 nm In a light-emitting layer having its host material doped with the first dopant material at the above concentration, an emission spectrum had an emission peak wavelength at 460 nm and a half width of 56 nm. In a light-emitting layer having its host material doped with the second dopant material at the above concentration, an emission spectrum had an emission peak wavelength at 440 nm and a half width of 51 nm. In the light-emitting layer of the second practical example which has its host material doped with the first and second dopant materials at the above concentrations, the half width is increased to 70 nm.

Third Practical Example

In a third practical example, organic electroluminescent elements that emit red, green, and blue light is fabricated. Each organic electroluminescent element includes an anode, a hole transport layer, a light-emitting layer, an electron injection layer, and a cathode, which are stacked in that order. The layers have the following configuration.
(a) Anode:
Material: aluminum (R, G, B)
Thickness: 300 nm (R, G, B)
(b) Hole Transport Layer:
Material: NPB (R, G, B)
Thickness: 70 nm (R), 50 nm (G, B)
(c) Light-Emitting Layer:
Host material: Alq3 (R, G), styrylamine (B)
Host thickness: 60 nm (R), 50 nm (G), 20 nm (B)
Dopant material: Btp2Ir(acac) (R), $Ir(ppy)_3$ (G), FIrpic (B)
Volume concentration of dopant material with respect to host material: 0.5% (R, G, B)
(d) Electron Injection Layer:
Material: magnesium (R, G, B)
Thickness: 10 nm (R, G, B)
(e) Cathode:
Material: ITO (R, G, B)
Thickness: 100 nm (R, G, B)

In the third practical example, the emission spectra have emission peak wavelengths at 615 nm for the red color, 510 nm for the green color, and 470 nm for the blue color. Referring to FIG. 6, the inclination-angle relationships among the red color at 615 nm, the green color at 510 nm, and the blue color at 470 nm in the visibility spectrum curve are as follows: red<blue<green. Therefore, in order to reduce color shifts caused by a change in the viewing direction, the half widths must satisfy the magnitude relationship: red<blue<green. After measuring the half widths in the third practical example, the following half width values were obtained: 36 nm for the red color, 55 nm for the blue color, and 65 nm for the green color. This proves that color shifts are reduced.

What is claimed is:
1. An electroluminescent device comprising:
a first and a second optical output parts operable to emit light, wherein a first emission peak wavelength represents a wavelength at which an emission spectrum of the light from the first optical output part reaches a first maximum intensity value, and a second emission peak wavelength represents a wavelength at which an emission spectrum of the light from the second optical output part reaches a second maximum intensity value, wherein the visibility spectrum curve comprises a first inclination value at the first emission peak wavelength, and a second inclination value at the second emission peak wavelength, both of the first and the second inclination values being greater than zero, and the second inclination value being greater than the first inclination value, and wherein a second width of the emission spectrum of the second optical output part is broader than a first width of the emission spectrum of the first optical output part.

2. The electroluminescent device according to claim 1, wherein each of the first and the second optical output parts comprises a light-emitting layer and a resonator structure operable to resonate light emitted from the light-emitting layer.

3. The electroluminescent device according to claim 1, wherein each of the first and the second emission peak wavelengths of the corresponding optical output parts is within a wavelength range in which an intensity of the transmission spectrum of each corresponding optical output parts is 95% or more of the maximum intensity value of the transmission spectrum of other optical output parts.

4. The electroluminescent device according to claim 1, wherein the first width is a width at a half maximum intensity value of the emission spectrum from the first optical output part, and the second width is a width at a half maximum intensity value of the emission spectrum from the second optical output part.

5. The electroluminescent device according to claim 1, further comprising a third optical output part operable to emit light, wherein a third emission peak wavelength represents a wavelength at which an emission spectrum of the light from the third optical output part reaches a third maximum intensity value, and wherein the visibility spectrum curve further comprises a third inclination value at the third emission peak wavelength, the third inclination value being less than zero.

6. The electroluminescent device according to claim 5, wherein the second width of the emission spectrum of the second optical output part is broader than a third width of the emission spectrum of the third optical output part.

7. The electroluminescent device according to claim 6, wherein the third width is a width at a half maximum intensity value of the emission spectrum from the third optical output part.

8. The electroluminescent device according to claim 2, wherein each of a first and a second resonant wavelength represents a wavelength at which a transmission spectrum of light transmitted through the resonator structure of the corresponding optical output parts in a direction perpendicular to a main surface of the light-emitting layer in each of the optical output parts reaches a maximum intensity value, the first and the second resonant peak wavelengths are set substantially equal to each other.

9. The electroluminescent device according to claim 2, wherein each of the first and the second optical output parts further comprises a pair of electrodes between which the light emitting layer is disposed, and wherein each resonator structure comprises one or more layers interposed between the electrodes.

10. The electroluminescent device according to claim 2, further comprising a substrate on which the first and the second optical output parts are disposed; and a sealing film which covers the first and the second optical output parts and transmits the lights emitted from the first and the second optical output parts, and wherein the sealing film is included in the resonator structures.

11. The electroluminescent device according to claim 2, further comprising a transparent substrate on which the first and the second optical output parts are disposed, the transparent substrate transmitting the lights emitted from the first and the second optical output parts, and wherein the transparent substrate is included in the resonator structures.

12. The electroluminescent device according to claim 2, wherein the resonator structures include all layers and components through which the light emitted from each of the first and the second optical output parts passes.

* * * * *